(12) United States Patent
Storms

(10) Patent No.: US 7,936,618 B2
(45) Date of Patent: May 3, 2011

(54) MEMORY CIRCUIT AND METHOD OF SENSING A MEMORY ELEMENT

(75) Inventor: Maurits Storms, Best (NL)

(73) Assignee: NXP B.V., Eindhoven (NL)

( * ) Notice: Subject to any disclaimer, the term of this patent is extended or adjusted under 35 U.S.C. 154(b) by 279 days.

(21) Appl. No.: 12/297,287

(22) PCT Filed: Apr. 19, 2007

(86) PCT No.: PCT/IB2007/051414
§ 371 (c)(1),
(2), (4) Date: Oct. 15, 2008

(87) PCT Pub. No.: WO2007/122564
PCT Pub. Date: Nov. 1, 2007

(65) Prior Publication Data
US 2009/0279370 A1 Nov. 12, 2009

(30) Foreign Application Priority Data
Apr. 24, 2006 (EP) .................................. 06112988

(51) Int. Cl.
*G11C 7/12* (2006.01)
*G11C 7/06* (2006.01)

(52) U.S. Cl. ......... 365/189.15; 365/185.25; 365/185.21; 365/202; 365/203; 365/204; 365/207

(58) Field of Classification Search ............. 365/185.25, 365/202, 203, 204, 185.21, 189.15, 148, 365/158, 163, 171, 173, 207
See application file for complete search history.

(56) References Cited

U.S. PATENT DOCUMENTS

| 4,962,482 | A | * | 10/1990 | Jinbo | 365/189.11 |
| 5,056,063 | A | * | 10/1991 | Santin et al. | 365/185.21 |
| 5,200,924 | A | | 4/1993 | Wong | |
| 5,258,669 | A | * | 11/1993 | Nakashima | 327/51 |
| 5,258,955 | A | * | 11/1993 | Gaultier | 365/203 |
| 5,926,428 | A | | 7/1999 | Rao | |
| 6,323,693 | B1 | | 11/2001 | Park | |
| 2002/0057597 | A1 | | 5/2002 | Fuchigami et al. | |

FOREIGN PATENT DOCUMENTS

| EP | 0329141 A1 | 8/1989 |
| WO | 0213198 A1 | 2/2002 |
| WO | 03067598 A2 | 8/2003 |

\* cited by examiner

*Primary Examiner* — J. H. Hur

(57) ABSTRACT

The memory circuit comprises at least one memory element (T1), a sense amplifier (SA) for sensing a state of the memory element (T1), a switching device (T2) for selectively coupling the sense amplifier (SA) to the memory element (T1), The sense amplifier (SA) comprises a first module (M1) and a second module (M2). The first module (M1) provides a first current limited to a maximum value (Iref+Ibias). The second module (M2) provides a second current which decreases from a value higher than the maximum value at the start of a sensing operation until a value lower than the maximum value at the end of the sensing operation. The memory circuit has a third module (CS2) for sinking a third current (Ibias) at a side of the switching device (T2) coupled to the memory element (T1).

18 Claims, 3 Drawing Sheets

MEMORY CIRCUIT AND METHOD OF SENSING A MEMORY ELEMENT

The present invention relates to a memory circuit.

The present invention further relates to a method for sensing a memory element.

A typical memory circuit comprises a plurality of memory elements that are arranged in a matrix formed by bit lines and word lines. A single memory element can be selected by activating the word line and sensing the bit line coupled to that memory element. The state of the cell can be determined by sensing the current conducted by the bit line or the voltage at the bit line. Therewith it should be taken into account that the bit line has an inherent capacitance which influences the current conducted by the bit line or the voltage measured at the bit line. The current conducted by the bit line includes a charging current in addition to a current conducted by the selected memory element. Consequently this also influences the voltage measured at the bit line. This parasitic effect delays the sensing process.

To distinguish cell current from charge current the bit line needs to be charged until the current provided at the bit line has decreased at least until below the reference level of the memory element. As the bit line is equivalent to a large capacitor and the pass gates between the sense amplifier and the memory element act as resistance, the charge curve is exponential (RC curve). If the memory element is in a conductive state the asymptotical value of the charge curve will be lower than that in the non-conductive state of the memory element. If the voltage at the bit line exceeds a threshold voltage at a point in time after the start of sensing it can be determined that the memory element is in a high-impedance state. If at that point in time the voltage has not exceeded the threshold voltage it can be determined that the memory element is low-impedance state. The threshold voltage may be equal to the asymptotic value associated with the low-impedance state or have a value between the asymptotic values for the low-impedance and the high-impedance state.

It is a purpose of the invention to accelerate the sensing process.

In the memory circuit according to the invention, as claimed in claim 1, an additional third module is coupled at a side of the switching device coupled to the memory element. The third current sinked by the third module in combination with the first current provided by the first module, changes the asymptotical values of the charge curves for the conductive and the non-conductive state of the memory cell. Due to this change it can be determined at an earlier point in time whether the threshold value is exceeded or not.

A corresponding method is claimed in claim 3.

It is noted that from U.S. Pat. No. 5,200,924 a memory circuit is known in FIG. 4, comprising an SRAM cell and a first and a second current source, a selection element controlled by a column select signal and a sense transistor controlled by a sense voltage. The first current source is coupled via a diode to a first side of the selection element. The memory element is also coupled to the first side of the selection element. A first main terminal of the sense transistor is coupled to the first side of the selection element. A second main terminal thereof is coupled to a supply rail. The second current source is coupled to a second side of the selection element. The first current source, maintains the bitline charged if it is not selected, i.e. the selection element is not conducting. If the selection element is enabled the bitline is rapidly discharged by the second current source. In the course of discharging a situation is reached where the current provided by the first current source, the current provided by the sense transistor or the current provided by the memory cell (depending on the state of the memory cell) compensates the current sinked by the second current source. As shown in FIG. 3 of the cited US patent, the asymptotic voltages $B_H$ and $B_{SL}$ do not change due to the measure presented therein, but merely the discharging speed of the bitline is changed. Contrary thereto, in the present invention the asymptotic value of the discharge curves is changed.

The dependent claim 2 describes a preferred embodiment wherein the sense amplifier has a feedback element for limiting a voltage at the input of the sense amplifier to a predetermined value. In this way also the voltage at the bit line is limited, which serves to protect the memory elements if the circuit is driven at a relatively high voltage.

These and other aspects of the present invention are described in more detail with reference to the drawing. Therein FIG. 1 shows a first embodiment of the present invention.

Figure 1:
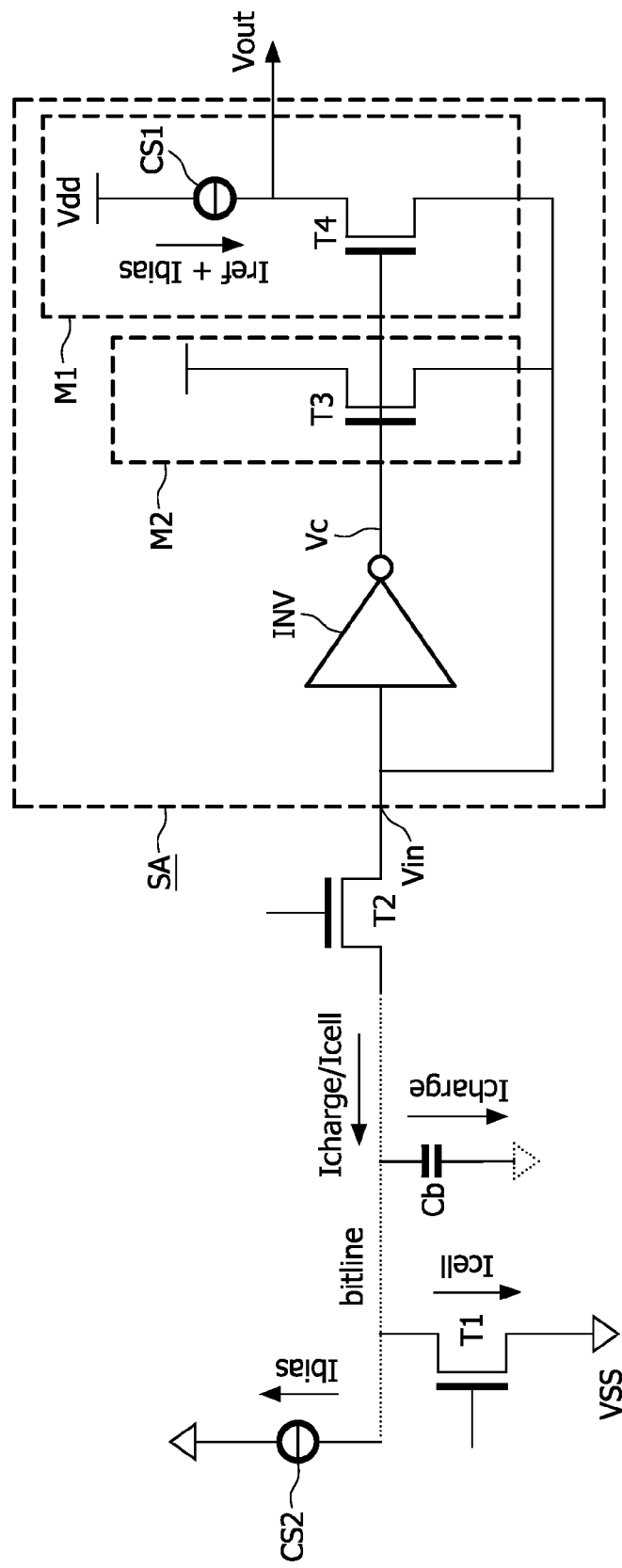

FIG. 1 shows a first embodiment of a memory circuit according to the present invention. For clarity only one memory element is shown, although it should be understood that a typical memory circuit comprises a plurality of memory elements arranged in a matrix of bit lines and word lines. Likewise for clarity those elements normally present in a memory circuit, but which are not essential for the present invention, such as address decoding circuitry, error encoding/decoding circuitry are not shown. Such elements can easily be designed by the skilled person on the basis of common knowledge.

The memory circuit shown comprises a memory element, schematically indicated in the form of a transistor T1. The memory element may have a low-impedance or a high-impedance state, e.g. representing a logical value "1" or "0" respectively. The memory circuit comprises a sense amplifier SA for sensing the state.

The memory circuit further comprises a switching device T2, also denoted as pass gate for selectively coupling the sense amplifier SA to the memory element T1. The switching device may be controlled by a decoder, such as a column decoder for example.

The sense amplifier SA comprises a first module M1 comprising a current source CS1 for providing a first current limited to a maximum value Iref+Ibias, and a second module M2 comprising a current regulator in the form of a transistor T3. The memory circuit has a third module CS2 for sinking a third current Ibias at a side of the switching device T2 coupled to the memory element T1. FIG. 1 further schematically shows the parasitic bit-line capacitance Cb.

In the embodiment shown the sense amplifier has a feedback element in the form of an inverter INV having an input coupled to the input of the sense amplifier SA, and an output coupled to a control gate current regulator formed by transistor T3. The output is further coupled to a control electrode of a further current regulating element formed by transistor T4 arranged in series with the current source CS1.

The operation of the memory circuit according to the invention is now described with reference to FIGS. 2a and 2b. First, referring to FIG. 2a, it is assumed that the bias current Ibias provided by the third module CS1 equals to 0, and that the current source CS1 merely provides a reference component Iref. The reference component Iref is a fraction, e.g. 50% of the current conducted by the memory cell T1 in its conducting state. In an embodiment the current Icell conducted by the memory cell T1 in its conducting state is 20 μA, and the reference current Iref is 10 μA.

Figure 2A:
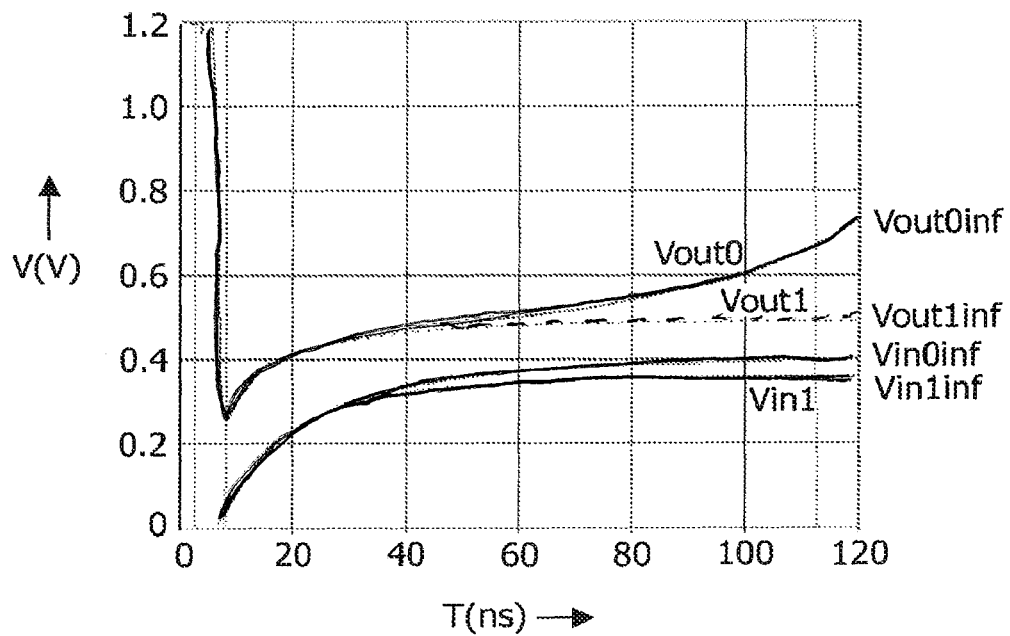
FIG. 2a shows various signals in an embodiment not according to the invention.
Figure 2B:
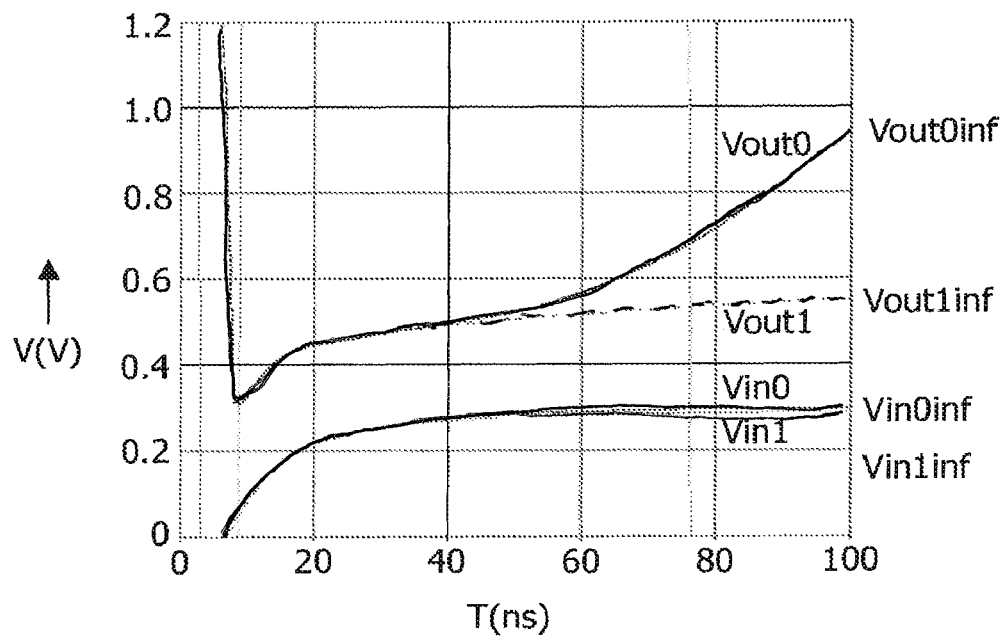
FIG. 2b shows various signals in the embodiment according to FIG. 1.

In FIG. 2a the curves Vin1 and Vout1 respectively represent the voltage at the input and the output of the sense amplifier SA, when the memory cell T1 is in its conducting state. The curves Vin0 and Vout0 respectively represent the voltage at the input and the output of the sense amplifier SA, when the memory cell T1 is in its non-conducting state.

Consider first the case wherein the memory cell T1 is in its conducting state. The current provided to the bit line is partly conducted by the memory cell T1 as a current Icell, and partly charges the bitline with Icharge. At the start of sensing the switching element T2 is controlled in a conducting state, e.g. by a word line driver. Initially the voltage Vin at the input of the sense amplifier SA is low. In response thereto the feedback element INV provides a relatively high control voltage to control gates of transistors T3 and T4. Although T4 of the first module has a relatively wide channel, as compared to transistor T3 of the second module, the current provided by the second module T3 is relatively high, as the current provided by the first module is limited by current source CS1 to Iref. Preferably the width ratio between the transistors T4 and T3 is in the range of 2 to 5, e.g. 4. In this phase of sensing the bitline is mainly charged by the relatively large current provided by the second module M2,T3. This causes the voltage at the input of the sense amplifier SA to rise. In response thereto the control voltage Vc provided by the feedback element INV is lowered. Consequently the conductivity of current regulating elements formed by transistors T4 and T3 in the first and the second module M1, M2 is reduced. In this phase of sensing the current provided by the first module M1 is no longer limited by the current source CS1, but by the current regulating element T4 of the first module M1. The current provided by the second module M2 is proportionally lower according to the ratio in channel width of the transistors T4 and T3. The voltage Vin1 and Vout1 approach an asymptotical value Vin1inf, Vout1inf respectively. Consequently the second module M2 serves as a controlled bitline charge device in the first phase of sensing. The first module serves as a device to disconnect the bitline capacitance from the sense output in the second phase and module M1 in its entirety functions as a comparator to compare the sense current with a reference current.

When the memory cell is in its non-conductive state, the current provided by the sense amplifier SA is equal to the charge current Icharge. The voltage Vin at the bitline sensed at the input of the sense amplifier SA now rises to a higher level until the feedback element controls the current regulating elements T4, T3 of modules M1 and M2 in a substantially non-conducting state. The output voltage Vout0 approaches the supply voltage Vdd.

The state of the memory cell can be determined by comparing the output voltage Vout with a threshold value Vt. If the output voltage Vout has trespassed the threshold value Vt, at a decision moment Td, it is decided that the memory cell is non conducting. If the output voltage Vout has not trespassed the threshold value Vt, at the decision moment Td, it is decided that the memory cell is conducting.

The decision moment should be selected at a point in time where in the non conducting state of the memory cell the output voltage normally has sufficiently increased above the threshold level Vt to enable a reliable detection. In the example of the memory circuit described above a reliable detection is considered to be possible at a decision time Td=112 ns, with a threshold level of 0.58 V. At that point in time the voltage Vout at the output of the sense amplifier SA has a sufficient deviation from the threshold voltage to enable a reliable detection.

The memory circuit according to the invention has a third module CS2 for sinking a third current Ibias at a side of the switching device T2 coupled to the memory element T1. The bias current Ibias has for example a value in the range of 1 to 5 times the value of the reference current. The current provided by the first module M1 is limited to a value which is equal to the sum of a reference current Iref and said third current Ibias. Due to this additional current Ibias, which is provided additionally by the first module M1, and sinked by the third module CS2, the setting point of the memory circuit changes, as is illustrated by FIG. 2b. Therein the curves Vin0 and Vout0 respectively represent the voltage at the input and the output of the sense amplifier SA, when the memory cell T1 is in its non-conducting state. The curves Vin1 and Vout1 respectively represent the voltage at the input and the output of the sense amplifier SA, when the memory cell T1 is in its conducting state. It can be seen therein that due to the additional supplied and sinked current the asymptotical value of the bitline voltage Vin measured at the input of the sense amplifier SA is reduced both in the conducting and the non-conducting state of the memory cell. As the asymptotical value is reduced, the point in time where a reliable detection can take place is advanced. Surprisingly the difference between the bit-line voltages Vin0 and Vin1 in the conducting and the non-conducting state of the memory cell is reduced, while the voltage Vout0 measured at the output of the sense amplifier SA more rapidly approaches in case of the non-conducting memory cell, than in the memory arrangement without the additional supplied current Ibias. In this example, where the bias current is 20 μA, i.e. twice the reference current Iref, a reliable detection is possible at Td=77 ns using a threshold Vt=0.60 V. The value of the bias current Ibias may be selected by the skilled person, taking into account that the bias current should not be too low, e.g. not lower than the reference current Iref, otherwise the detection time would not be shortened significantly. On the other hand the value of the current source should not be too high, e.g. not more than 10 times the value of the reference source, because this would require expensive measures to minimize the difference between a value of the current provided by current source CS2 and the additional current provided by the first module M1.

Figure 3:
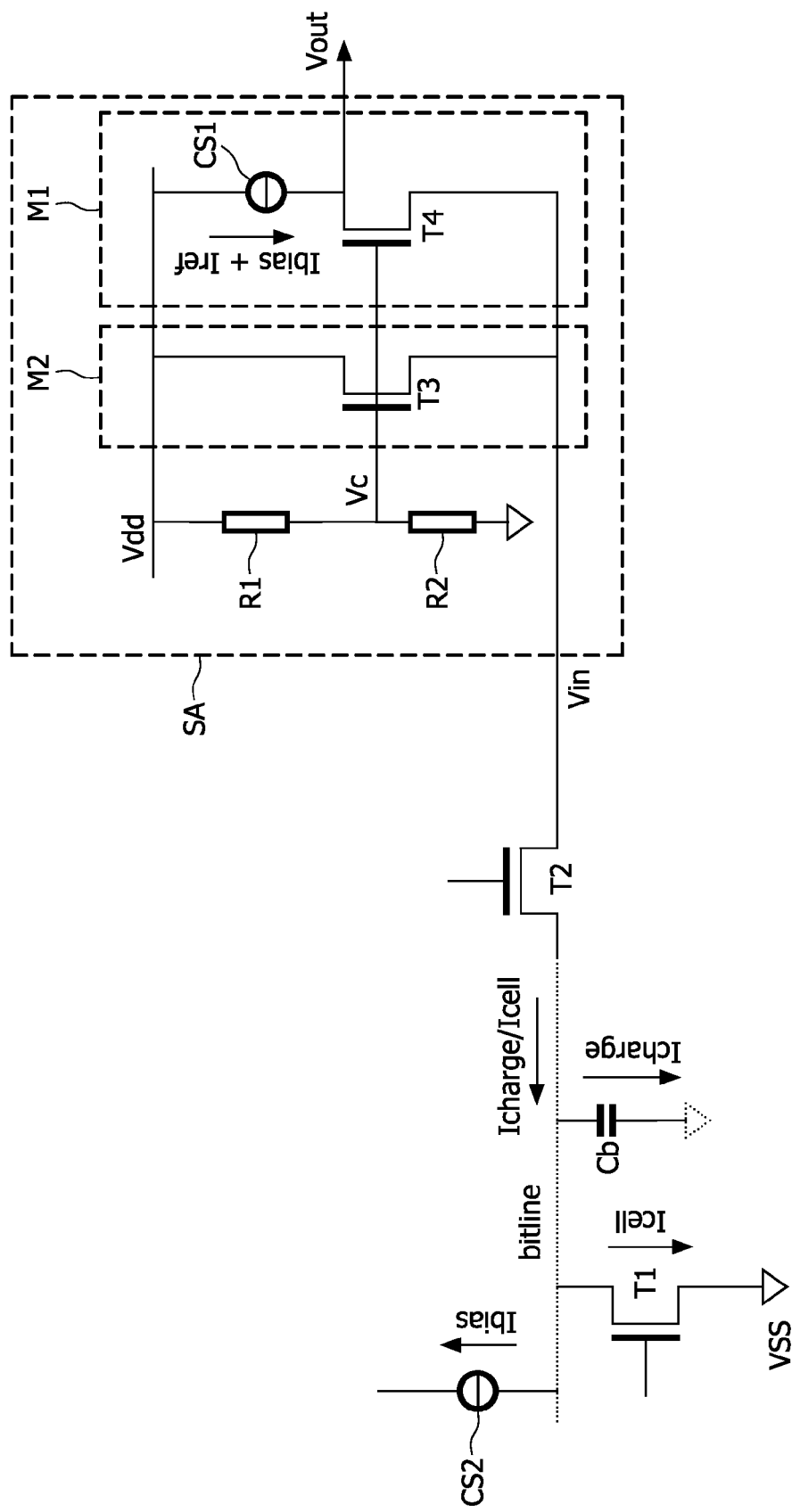
FIG. 3 shows a second embodiment of the present invention.

Another embodiment of the memory circuit of the present invention is described with reference to FIG. 3. This embodiment is particularly suitable for lower voltage ranges. In this embodiment the feedback element is lacking. Instead a voltage divider R1,R2 provides the control inputs of the current regulating elements T3, T4 with a fixed reference voltage. At the start of the sensing procedure the first and the second module M1, M2 of the sense amplifier SA together provide a current to the bitline. In this first phase of the sensing the current provided by module M2 is higher than the current provided by module M1, as the current provided by the latter is restricted by current source CS1. As a result of charging of the bit line the voltage Vin at the input of the sense amplifier SA gradually rises. Due to the fact that Vin rises the voltage difference Vc-Vin decreases. Consequently the conductability of the current regulators decreases. In a second sensing phase, following the first sensing phase, the conductability of the current regulators is reduced to such an extent that the current source CS1 is no longer the limiting factor in module M1. The modules M1, M2 now provide a current which is mutually related according to the channel width of the current regulators. The voltage Vin at the input of the sense amplifier approaches an asymptotical value depending on the state conducting/nonconducting of the memory element. Also in this embodiment the bias current which is additionally provided by the first module M1, and sinked by the third module CS2 results in a shift of the asymptotical value. As a result a reliable detection of the state of the memory cell T1 can be made at an earlier point in time.

It is clear to the skilled person that many variations are possible. E.g. different types, e.g. conductivity types of switching elements and current control elements may be used. Preferably the switching elements and current control elements are MOS FETS, in view of their low power consumption. Alternatively however bipolar devices or other kinds of devices may be used. The polarity of the currents and voltages may be reversed. Although the invention is particularly suitable for NAND Flash memory, the invention is equally applicable to other types of resistive memory, such as MRAM and phase change RAM.

The invention is not limited to a memory having only two memory states, but may also be applied in a multilevel type of memory, e.g. in a memory wherein the resistance of the memory cells is selected from four levels.

It is remarked that the scope of protection of the invention is not restricted to the embodiments described herein. Parts of the system may implemented in hardware, software or a combination thereof. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

The invention claimed is:

1. A memory circuit comprising
at least one memory element,
a sense amplifier for sensing a state of the memory element,
a switching device for selectively coupling the sense amplifier to the memory element,
wherein the sense amplifier comprises a first module for providing a first current limited to a maximum value, and a second module for providing a second current which decreases from a value higher than the maximum value at the start of a sensing operation until a value lower than the maximum value at the end of the sensing operation, and wherein the memory circuit has a third module for sinking a third current at a side of the switching device coupled to the memory element.

2. A memory circuit according to claim 1, wherein the sense amplifier has a feedback element for limiting a voltage at the input of the sense amplifier to a predetermined value.

3. The circuit of claim 1, wherein the second module includes a transistor having source/drain electrodes directly connected between an input voltage supply and the switching device.

4. The circuit of claim 1,
further including an inverter having its input connected to the switching device, and
wherein the second module includes a transistor having source/drain electrodes connected between an input voltage supply and the switching device, and a gate that is connected to an output of the inverter.

5. The circuit of claim 1,
wherein the first module includes a transistor having source/drain electrodes connected between an output indicative of the sensed state of the memory element and the switching device,
wherein the second module includes a transistor having source/drain electrodes connected between an input voltage supply and the switching device, and
further comprising an inverter having its input connected to the switching device and its output connected to drive gates of the transistors of the first and second modules.

6. The circuit of claim 1, wherein the second module is configured to provide the second current during an entire sensing operation during which the first module is active.

7. The circuit of claim 1, wherein the second module includes a transistor having source/drain electrodes directly connected between an input voltage supply and the switching device and configured to provide the second current during an entire sensing operation during which the first module is active.

8. The circuit of claim 1, wherein the second module consists of a single transistor having source/drain electrodes directly connected between an input voltage supply and the switching device.

9. The circuit of claim 1, wherein the memory element is directly connected to the switching device via a bitline.

10. The circuit of claim 1, wherein the memory element is directly connected to the switching device via a bitline, and the third module is connected to a common circuit node that connects both the memory element and the third module to the bitline.

11. The circuit of claim 1, wherein the third module is connected to sink current at a node between the switching device and the memory element.

12. Method for sensing a memory cell with a sense amplifier, the sense amplifier and the memory cell being coupled at a first and a second side of a switching device, the method comprising the following steps,
closing the switching device,
providing a first and a second current at a first side of the switching device, wherein the first current is limited to a maximum value, and the second current decreases from a value higher than the maximum value at the start of a sensing operation until a value lower than the maximum value at the end of the sensing operation, and
sinking a third current at a side of the switching device coupled to the memory cell.

13. The method of claim 12, wherein providing a first and second current includes providing the first current from a current source at an output of the sense amplifier, the output being indicative of a state of the memory circuit, using a transistor directly connected between the current source and the switching device.

14. The method of claim 12, wherein providing a first and second current includes providing the second current during an entire sensing operation during which the first current is provided.

15. The method of claim 12, wherein providing a first and second current includes respectively providing the currents during a sensing operation in response to an inverter-applied voltage to the gates of transistors that respectively connect the first and second currents to the switching device, the transistor connecting the first current being connected directly between a current source and the switching device.

16. The method of claim 12, wherein sinking a third current at a side of the switching device coupled to the memory cell includes sinking the third current at a circuit node on a bitline connected between the switching device and the memory cell.

17. A sense amplifier circuit comprising:
a switch configured to selectively couple the sense amplifier circuit to a memory cell;
a first sense circuit connected between the switch and an output of the sense amplifier circuit;
a second sense circuit connected between the switch and a voltage source; and
during a sensing operation,
the switch couples the first and second sense circuits to the memory cell,
the first sense circuit provides a first current having an upper limit to the switch, and outputs a voltage level indicative of a state of the memory cell, and
the second sense circuit provides a second current that decreases from a value higher than the upper limit of the first current at the start of the sensing operation, to a non-zero value lower than the upper limit at the end of the sensing operation.

18. The circuit of claim 17, further including an inverter connected between the switch and the first and second sense circuits, and configured to turn the first and second sense circuits on.

* * * * *